(12) United States Patent
Bischel

(10) Patent No.: US 6,444,297 B1
(45) Date of Patent: Sep. 3, 2002

(54) METHOD OF PRODUCING A THICK FILM METALLIZATION ON AN ALUMINUM NITRIDE SUBSTRATE

(75) Inventor: Richard Bischel, Pinellas Park, FL (US)

(73) Assignee: Electro Technik Industries, Inc., Clearwater, FL (US)

( * ) Notice: Subject to any disclaimer, the term of this patent is extended or adjusted under 35 U.S.C. 154(b) by 133 days.

(21) Appl. No.: 09/619,458

(22) Filed: Jul. 19, 2000

(51) Int. Cl.$^7$ ................................................. B32B 3/00
(52) U.S. Cl. ........................ 428/209; 428/210; 174/259
(58) Field of Search ................................ 428/210, 209; 174/259

(56) References Cited

U.S. PATENT DOCUMENTS

| | | | |
|---|---|---|---|
| 4,539,223 A | | 9/1985 | Hormadaly |
| 4,659,611 A | * | 4/1987 | Iwase et al. ............... 428/209 |
| 4,906,514 A | * | 3/1990 | Francis et al. ............. 428/209 |
| 4,939,022 A | * | 7/1990 | Palanisamy ................ 428/209 |
| 5,393,558 A | * | 2/1995 | Allison et al. ............. 427/126.2 |
| 5,491,118 A | | 2/1996 | Hormadaly |

\* cited by examiner

Primary Examiner—Cathy Lam
(74) Attorney, Agent, or Firm—Larson & Larson, PA; James E. Larson

(57) ABSTRACT

A metallization layer structure is applied to an aluminum nitride substrate by the application of an intermediate buffer layer of either silicon monoxide or silicon dioxide. Conventional oxide bonding conductor and resistor formulations can then be applied and readily bonded to the intermediate buffer layer resulting in thermally and mechanically stable structure on the surface of the aluminum nitride substrate.

5 Claims, 2 Drawing Sheets

METHOD OF PRODUCING A THICK FILM METALLIZATION ON AN ALUMINUM NITRIDE SUBSTRATE

BACKGROUND OF THE INVENTION

This invention relates to a metallization process for aluminum nitride ceramic substrates having a low thermal expansion and a high degree of thermal conductivity. More particularly, this invention refers to a method of producing a thick film oxide based metallization layer structure on an aluminum nitride ceramic by the addition of an intermediate buffer layer over the aluminum nitride substrate.

Traditionally, beryllium oxide ceramics (BEO), or other materials containing an oxide base, have been used as the substrate material to effectively remove heat and function as a major structural element for the production of active and passive microwave devices. Usually, there is a need to firmly fasten pins or terminal assemblies of various natures, for purposes of electrical connection, to these oxide based ceramics. Conventionally, a metallization is established so that a metallization layer can be created on the ceramic of the oxide based system. This metallization functions as an attached adhesive layer so that the aforementioned pins can be firmly attached to the oxide based ceramics. Readily available thick film oxide based materials are used for this metallization attachment. Pins or terminal assemblies can then be mounted on the metallization layer created on the oxide based ceramics. These assemblies are then soldered or brazed in place. Examples of the conventional systems have been disclosed in the Japanese Laid-Open patent application No.'s 79910/1978, 207691/1984, 57997/1985, U.S. Pat. No. 4,539,223, relating to thick film resistor compositions and U.S. Pat. 5,491,118, relating to thick film paste compositions.

More recently, however, there has been growing concern in the European communities about the toxicity and disposal of devices containing beryllium oxide. The beryllium oxide ceramic remains the best thermal heat conductor of all the various oxide based ceramics and has a very favorable dielectric constant for microwave applications. This material has been in high demand, in the past, for these reasons. In an effort to slowly replace the beryllium oxide ceramics and phase in a more environmentally favorable ceramic, aluminum nitride ceramics have been considered. The properties of aluminum nitride with respect to thermal expansion, thermal conductivity and dielectric constant are not quite as favorable as beryllium oxide. However, they are still very acceptable for the fabrication of microwave devices. As an example, aluminum nitride has three to eight times the thermal conductivity of previously used alumina ceramics. Unfortunately, standard thick film oxide metallizations do not react favorable with the active surface of the aluminum nitride ceramics. This is specific to aluminum nitride since it does not contain any appreciable lattice oxygen network necessary to form an oxide eutechnic bond with the metallic thick film oxide based material. Consequently, a conventional metallic thick film oxide layer directly on an aluminum nitride ceramic substrate can be broken loose from the aluminum nitride ceramic substrate. This leads to questionable reliability (bond integrity) at room temperature. If the substrate is stressed via thermal shock or thermal cycling and the coefficient of linear expansion is changing, there is little chance that the bond will remain intact. A method is needed to facilitate bonding of thick film metallization on aluminum nitride ceramic substrates.

SUMMARY OF THE INVENTION

The present invention provides means for applying useful metallization layer structures on aluminum nitride ceramics such that the previously described problems with metallization layer adherence integrity is overcome. The method of this invention produces a metallization layer structure having acceptable adhesive bond strength at room temperature and during accelerated environmental stress temperatures.

A specific object of the present invention is to provide a method of producing metallization layer structures on aluminum nitride ceramics that are capable of providing an improved device reliability with regard to fastening pins or terminal assemblies onto the surface.

The method of the present invention is achieved by applying an intermediate buffer layer on the aluminum nitride ceramic. This intermediate buffer layer contains silicon monoxide or silicon dioxide. A platinum, palladium/silver, or other precious metal thick film oxide based metallization layer is then applied over the aforementioned buffer layer. The metallization layer forms a heat resistant firmly adhered metallic layer capable of being soldered or brazed. Other resistive oxide based thick films also can be adhered on the buffer layer to provide additional reliable passive devices.

The aluminum nitride ceramic substrate employed is laser "diced", thus creating through holes such that a snap action can be used to separate smaller chips from the larger substrate and to provide groups of larger holes for the purpose of creating a wrap around metallization layer that would connect both sides of the aluminum nitride ceramic electrically.

BRIEF DESCRIPTION OF THE DRAWINGS

This invention can be best understood by those having ordinary skill in the art by reference to the following detailed description when considered in conjunction with the accompanying drawings in which.

SPECIFIC DESCRIPTION OF PREFERRED EMBODIMENT

The following numbered description applies to all of the figures set forth above.

Figure 1:
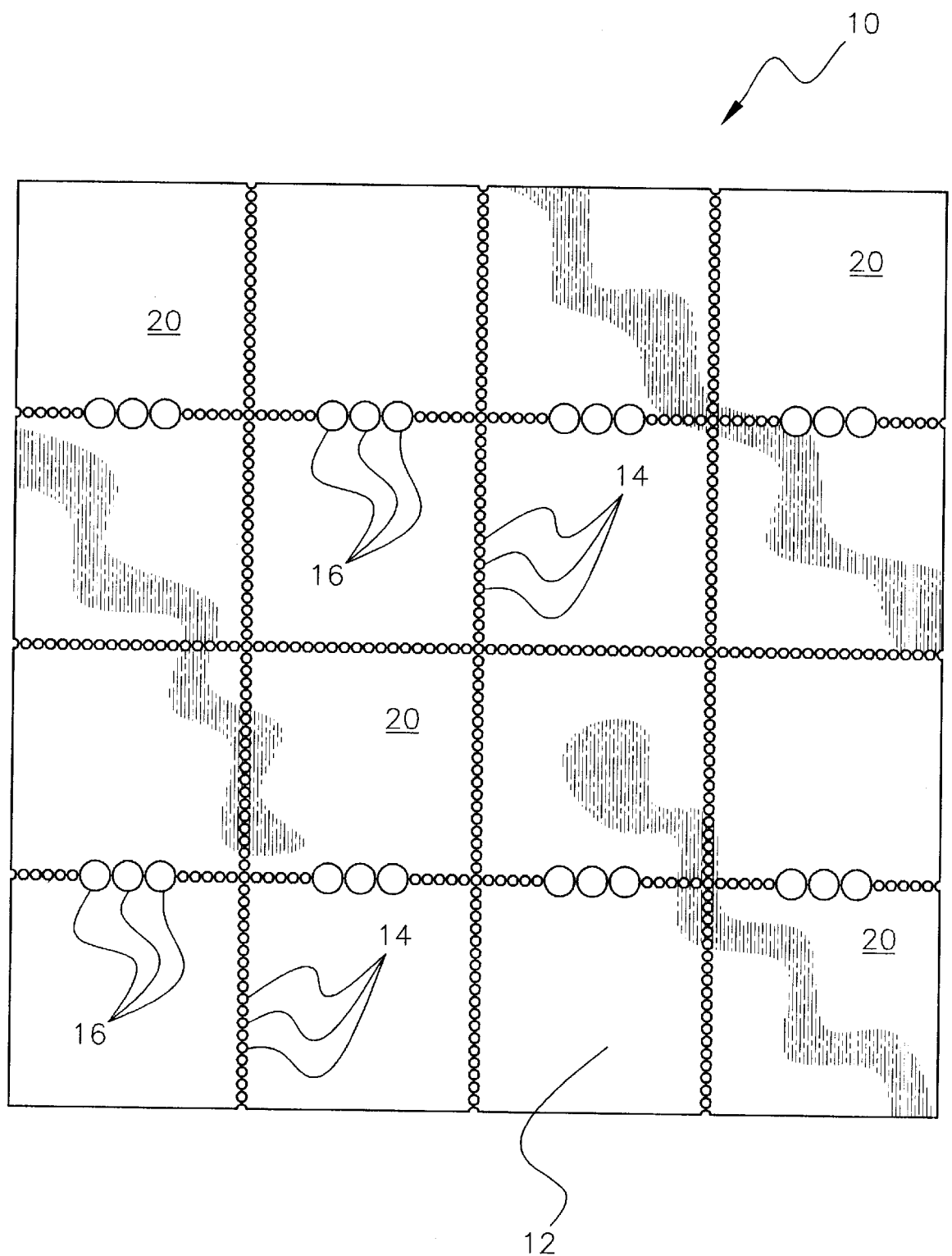
FIG. 1 shows a plan view of an aluminum nitride ceramic substrate with a buffer layer, the substrate having multiple chips that can be separated by a snap off action.

Referring to FIG. 1, the aluminum nitride ceramic substrate 10 is produced by conventional ceramic processing and has a density of at least 90% of the theoretical with a thermal conductivity of at least 100 W/m-K. It can be composed of a single layer structure or a multi-layer structure where a plurality of aluminum nitride plates are laminated together. The substrate 10 is laser diced to create holes 14 and 16.

A silicon monoxide or silicon dioxide thin film 12 is applied to all surfaces of the ceramic substrate 10 by a conventional process such as thermal evaporation, E-beam evaporation, ion-assisted growth, laser ablation or sputtering to a thickness of at least 900 Angstroms, and preferably to a thickness of about 3000 Angstroms, to adequately coat any convex or recessed portions 14 on a surface of the aluminum nitride ceramic substrate. Such a thickness is sufficient to isolate the aluminum nitride surface from subsequent metallizations. Adherence of the silicon monoxide or silicon dioxide buffer layer 12 is achieved by heating the aluminum nitride ceramic substrate, in a vacuum, between 350–450 degrees centigrade and maintaining this temperature throughout the application of the thin film process.

Prior to applying the silicon monoxide or silicon dioxide buffer layer 12 the aluminum nitride ceramic substrate 10 is "fire cleaned" in an argon gas shielded furnace following a ramp up from ambient temperature to 850 degrees centigrade and back to ambient temperature within 50 minutes. The substrate 10 is removed from the furnace and placed in a gas isolated storage box. It is then transferred and placed under a vacuum in a thin film evaporator for application of the buffer layer.

The large holes 16 also are coated in a vapor plume with a consistent layer of vacuum deposition grade silicon monoxide or silicon dioxide for establishment of the intermediate buffer layer 12 and subsequent "through hole" metallization. The silicon monoxide and silicon dioxide are employed in a pellet or powder form. A thick film metallization of platinum/silver oxide based thick metallic film 18 is thermally bonded to the oxygen atoms found in the silicon monoxide or silicon dioxide intermediate buffer layer. During the early portion of a temperature ramp profile, a nonvolatile resin portion of the thick film "vehicle" is pyrolyzed. Next, a glass "frit" flows causing sintering of the thick film particles. Chemical "bond" reactions take place to form the final film and provide the proper film adherence. Other common metallizations can be substituted for the platinum/silver oxide based thick film such as palladium/silver oxide based thick film or other precious metals. Additionally, a resistive thick film, such as described in U.S. Pat. No. 4,539,223, incorporated herein by reference, is added to the metallization layer. The resistive thick film is generally referred to as an ink or paste. This ink contains three components: a functional phase for electrical properties, a binder which provides adhesion, and a vehicle which allows for screen-printing. The resistor thick film ink is formulated with Ruthenium ($RuO_2$,$Bi_2Ru_2O_7$) doped glasses. The electrical value of the film is determined by varying the doping level of the glass.

Chips 20 can be separated from the entire substrate 10 by snapping off along the small holes 14 in one axis, or the small holes 14/large holes 16 combination in the other axis.

EXAMPLE I

The following steps are followed to produce the metallization product of this invention.

Figure 2:
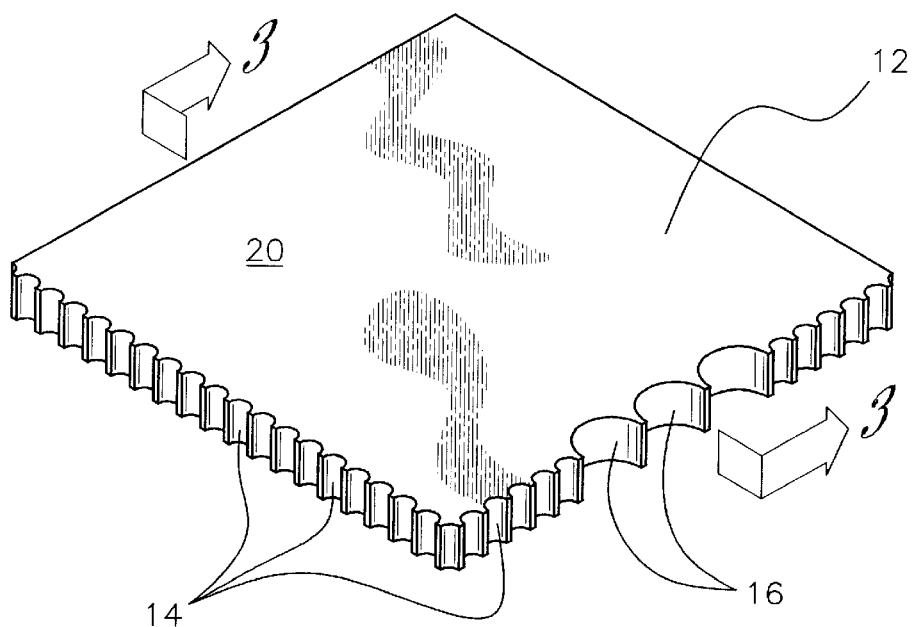
FIG. 2 shows a single chip snapped off from a lower left corner of the FIG. 1 substrate.
Figure 3:
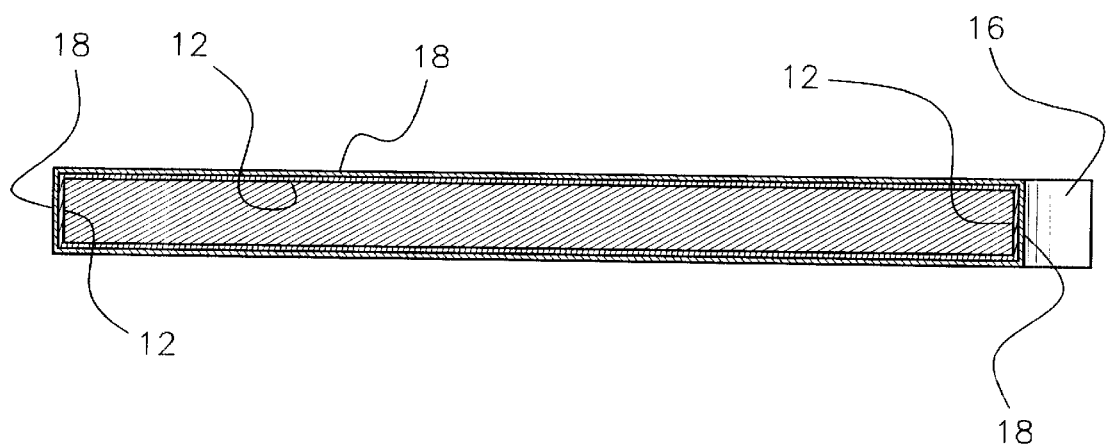
FIG. 3 shows a cross section of the chip of FIG. 2 along line 3—3 containing the buffer layer and a metallization.

An aluminum nitride ceramic substrate is laser diced into two groups of distinctive hole patterns as shown in FIG. 1 and FIG. 2. The substrate is then fire cleaned at 850 degrees C. The cleaning step is performed in an inert gas shielded furnace with a temperature ramp profile that comprises a fifty (50) minute cycle. Within minutes of the fire clean, the cleaned substrate is either stored in an inert gas-shielded glove box or stored at a high efficiency purified air (HEPA) work station.

To process the thin film, 900 to 2000 Angstroms of silicon monoxide is applied to both sides of the substrate. This is accomplished as follows:

(1) The substrate is placed into a sample holder in a thin film chamber.
(2) Begin to pump chamber and start the substrate heater. Set the heater temperature controller to 400 degrees C.
(3) When the chamber is at high vacuum (1×E-6 torr), the thermal evaporation is begun.
(4) Ramp up a thermal SiO "boat" to 325 amps. When "boat" current is stable, the shutter is opened and SiO is deposited for two minutes.
(5) The substrate heater is left on and the process is repeated on the other side of the substrate.

The substrate is then removed from the evaporator. Using a palladium/silver thick film conductor, the conductor is screen-printed over the silicon monoxide layer. The conductor is dried in a clean oven at 150 degrees C. for thirty minutes. Using the same thick film conductor, the conductor pattern is printed on the other side of the substrate. The conductor is dried in a clean oven at 150 degrees C. for thirty minutes. Resistor paste is then screened over the conductor and oven dried as described above. The conductor and resistor are fired together in an 850 degrees C. profile furnace. The furnace is Argon gas shielded to minimize contamination and to help speed up the removal of gasses thermally desorbed from the substrate. The resulting conductor and resistor material firmly adheres to the SiO substrate with no blistering.

EXAMPLE II

The above process steps are repeated except that silicon dioxide is substituted for the silicon monoxide. Similar results are achieved.

The adhesive strength of the platinum/silver oxide metallization layer 18 in both EXAMPLE I AND II, was tested by three methods: 1.) the 3M tape pull test 2.) elevated tensile strength pull test where brass flat head screws were soldered to the metallization layer and connected to a pull tester and 3.) thermal shock test using MIL-STD-202 method 107C employing a temperature of −35 degrees centigrade to +100 degrees centigrade. In each test, the metallization adhesive strength was satisfactory. As such, an invention has been disclosed in terms of a preferred embodiment thereof to provide a new and useful method of bonding a metallization to an aluminum nitride ceramic substrate.

Of course, various equivalent changes, modifications and alterations in the teachings of the present invention may be contemplated by those skilled in the art to achieve substantially the same results in substantially the same way without departing from the intended spirit and scope thereof.

As such, it is intended that the present invention only be limited by the terms of the appended claims.

What is claimed is:

1. A ceramic chip having an adhesively strong thick film metallization adhered thereto, the ceramic chip comprising:
   an aluminum nitride ceramic substrate,
   a layer of 900 angstroms to 3000 angstroms thick of a buffer selected from the group consisting of silicon monoxide and silicon dioxide and a precious metal metallization layer adhered to the buffer layer.

2. The ceramic chip according to claim 1 wherein the buffer layer is silicon monoxide.

3. The ceramic chip according to claim 1 wherein the buffer layer is silicon dioxide.

4. The ceramic chip according to claim 1 wherein the precious metal metallization is a palladium/silver thick film oxide.

5. The ceramic chip according to claim 1 wherein the precious metal metallization is a platinum/silver thick film.

* * * * *